United States Patent [19]

Vella

[11] Patent Number: 5,545,257
[45] Date of Patent: Aug. 13, 1996

[54] MAGNETIC FILTER APPARATUS AND METHOD FOR GENERATING COLD PLASMA IN SEMICONDUCTOR PROCESSING

[75] Inventor: Michael C. Vella, San Leandro, Calif.

[73] Assignee: Electro-Graph, Inc., Carlsbad, Calif.

[21] Appl. No.: 258,958

[22] Filed: Jun. 13, 1994

[51] Int. Cl.⁶ .................................................. C23C 16/00
[52] U.S. Cl. ........................... 118/723 R; 118/723 FE; 118/723 FI; 118/723 MR; 250/492.21
[58] Field of Search ................... 118/723 MR, 723 MA, 118/723 HC, 723 AN, 723 DC, 723 FE, 723 FI, 723 R; 156/345; 204/298.37, 298.16, 298.21; 315/111.31, 111.41, 111.81; 250/492.21, 492.3

[56] References Cited

U.S. PATENT DOCUMENTS

| | | | |
|---|---|---|---|
| 4,447,732 | 5/1984 | Leung et al. | 250/427 |
| 4,486,665 | 12/1984 | Leung et al. | 250/427 |
| 4,559,477 | 12/1985 | Leung et al. | 315/111.81 |
| 4,800,100 | 1/1989 | Herbots et al. | 427/38 |
| 4,985,626 | 1/1991 | Margulies | 250/292 |
| 5,145,554 | 9/1992 | Seki et al. | 156/643 |
| 5,181,986 | 1/1993 | Ohiwa | 156/643 |
| 5,189,303 | 2/1993 | Tanjyo et al. | 250/296 |
| 5,365,070 | 11/1994 | Anderson et al. | 250/423 R |

OTHER PUBLICATIONS

Holmes, A. J. T., Green, T. S. and Newman, A. F., "Development of a High Proton Yield Plasma Source with Multipole Confinement and a Magnetic Filter", *Rev. Sci. Instrum*, 58 (8), Aug. 1977, American Instiute of Physics, 1987, pp. 1369–1381.

Tanaka, Shigeru et al.; "Effects of Internal and External Magnetic Fields on the Characteristics of a Magnetic Multipole Plasma Source", *Rev. Sci. Instrum.*, 57 (2), Feb. 1986, American Institute of Physics, 1986, pp. 145–150.

*Primary Examiner*—R. Bruce Breneman
*Assistant Examiner*—Joni Y. Chang
*Attorney, Agent, or Firm*—Gray Cary Ware Freidenrich

[57] ABSTRACT

Disclosed herein is a system and method for providing a plasma flood having a low electron temperature to a semiconductor target region during an ion implantation process. The plasma generator providing the plasma is coupled to a magnetic filter which allows ions and low energy electrons to pass therethrough while retaining captive the primary or high energy electrons. The ions and low energy electrons form a "cold plasma" which is diffused in the region of the process surface while the ion implantation process takes place.

15 Claims, 11 Drawing Sheets

MAGNETIC FILTER APPARATUS AND METHOD FOR GENERATING COLD PLASMA IN SEMICODUCTOR PROCESSING

The United States Government has rights in this invention pursuant to Contract No. DE-AC03-76SF00098 between the United States Department of Energy and the University of California for the operation of the Lawrence Berkeley Laboratory.

FIELD OF THE INVENTION

The present invention relates to ion beam implantation processing, and more particularly to a plasma flood apparatus for dispersing plasma at a substrate's surface during processing.

BACKGROUND OF THE INVENTION

In semiconductor manufacturing charged particle processing tools, such as ion implantation, plasma etch, plasma deposition, or charged particle sputtering, are used to manufacture integrated circuits. Today's integrated circuit devices use relatively low voltages (e.g. 5 or 12 Volt logic are common). An adverse effect of the use of charge particle process tools which negatively impacts production yield is created because the charge particle processes inherently create potential differences across the process surface, or between surface and substrate. Potential differences only a few times the nominal voltage level can cause destructive breakdown of thin dielectrics or premature wearout of MOS transistors, if sufficient charge is available. For example, 30 Volts can easily destroy nominal 10 Volt devices. Moreover, even if yield does not seem negatively impacted by testing at the time of manufacture, charging damage can be manifested over time in that the effects do not appear until the integrated circuit has been used normally. Thus, an integrated circuit subject to excess electrical steps during processing may not be reliable.

Charging has traditionally been a problem for ion implantation because implant beams can easily create 30 Volt potential differences at the target substrate surface. Traditional solutions are to reduce implant current (which limits throughput), or to use an electron gun to neutralize beam potentials.

Alternatively, have recently begun ion beam implant vendors have begun to introduce plasma flood systems near the target. A plasma is an ionized gas, i.e., a gas in which some atoms or molecules have been stripped of at least one electron to create ions. Plasmas are quasi-neutral, which means that the density of ions and electrons is very nearly equal. Plasmas diffused near the beam and/or target surface are effective for controlling charging damage to integrated circuits during ion implantation because the presence of the plasma ions insures that a sufficient density of electrons is available to short out significant large scale potential differences.

However, as integrated circuit technology moves to ever smaller, faster transistors, the intrinsic threshold voltage decreases due to thinner dielectrics. For example, 3 Volt logic is currently being introduced, and 1.5 Volts is anticipated in the future. Lower logic levels means that previous damage thresholds will not be tolerated by the integrated circuit devices. Manufacturing tools which meet the lower thresholds for charging damage to integrated circuits will be required.

A plasma flood system of the prior art which causes plasma to be introduced to the process surface can itself bias the process surface, because of the energetic electrons associated with the generation of that plasma. In a typical plasma, the electron temperature is at least a few electron Volts, because energetic primary electrons (20 to 100 Volts) are needed to ionize the gas. Primaries, that is, energetic electrons, have the effect of raising the average electron energy, i.e. electron temperature, of the plasma. Moreover, raising the plasma density raises the required power at least proportionally, which can also increase the electron temperature, as well as the floating potential, of a surface which is exposed to the plasma.

In the generation of plasma, the natural potential of a small conductor exposed to the plasma is related to the energy of all electrons which can reach the conductor. The inherent floating potential of a plasma scales as a multiple (often 3 to 8) of the electron temperature. Thus, a plasma having a lower electron temperature which is achieved by removing the primary electrons, will have a lower characteristic floating potential than a plasma with primary electrons and a higher temperature.

A carefully designed magnetic field can separate the electron components of the plasma into a high electron temperature, plasma generation region, and a low electron temperature cold plasma region. In recent years, this technique has been given a name "magnetic filter."

A magnetic filter has a magnetic field just strong enough to confine the energetic primary electrons to the generation region, but weak enough to allow ions to cross. Low energy collisional electrons follow the ions, cross the filter to the cold region and maintain quasi-neutrality. Thus, ions in the cold regions are neutralized by collisional cold electrons. A plasma made up of ions and low temperature electrons is known as a "cold plasma." For example, see U.S. Pat. No. 4,447,732 issued to K. Leung et al. on May 8, 1984 for a particular type of magnetic filter used in conjunction with an ion beam accelerator wherein a specific magnetic design is used to produce a particular ion species for use in an ion beam.

SUMMARY OF THE INVENTION

According to the present invention, a plasma generator in communication with a magnetic filter is located in a charged particle process tool or system in a position is conducive to allowing plasma ions to diffuse in the region of a process surface. The plasma ions, via quasi-neutrality, insure a low temperature electron population at the process surface. The present invention includes the combination of a plasma generator and a magnetic filter to confine high energy electrons to a high temperature, higher plasma density region of the generator while allowing ions and low energy electrons to pass therethrough to a low temperature, lower density region which is in contact with the process surface. Thus a cold plasma is diffused into the region of the process surface to neutralize charge imbalance at the target surface in accordance with the present invention. In an ion implanter, this plasma generator is separate from that which is used to generate the ion beam itself. In a plasma or other charged particle process tool, the filter may separate the process surface from the rest of the system. In either case, the present invention provides the important effect of helping to reduce potential differences across the process surface and between surface and substrate, thereby reducing charging damage. It should be noted that potential differences in a plasma (or, induced by a plasma) depend on both the electron temperature and plasma density. Therefore, achieving acceptable plasma uniformity is also important.

Other objects and attainments together with a fuller understanding of the invention will become apparent and appreciated by referring to the following description and claims taken in conjunction with the accompanying drawings.

DETAILED DESCRIPTION OF THE INVENTION

It has been found that the charge to breakdown ($Q_{BD}$) of an insulator depends upon potential (V) across that insulator and the integrated current therefrom. In other words, if the potential at the surface is too high and too much current travels across the insulator, charging damage will be caused to the insulator. For example, the gate insulator of field effect transistors in integrated circuits usually has a conductor above it which may be exposed to a process beam or plasma. An undesirable effect of charge particle processing is that a potential difference can be induced across the insulator because the (conductive) substrate is at a different potential than the conductor above it.

In accordance with the present invention, it has been found that in order to minimize charge damage during ion implantation, neutralization of surface charge density at the target is required. In utilizing a plasma flood, the present invention includes controlling the electron temperature ($T_e$) of a plasma flood to minimize potential at the surface. Alternatively, the atomic mass of the plasma particles (A) can be controlled in order to affect the surface potential.

Figure 1:
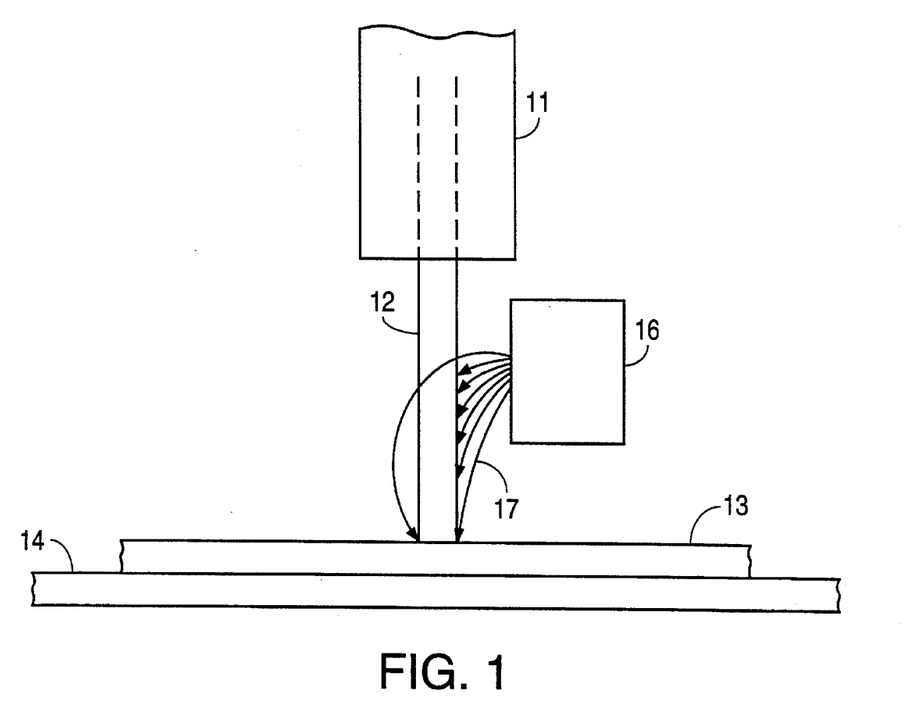
FIG. 1 generally depicts a system of the present invention.

A system of the present invention is generally depicted in FIG. 1. Ion beam generating apparatus 11 generates any type of ion beam used in semiconductor processing for the purpose of ion implantation. Typically an ion beam generator will include a plasma generator of its own with an accelerator, species separating device and a post acceleration and/or deceleration device. The ion beam 12 depicted by a partially dotted line passes from the ion beam generator to the target 13 which resides on a substrate carrying arrangement 14. The substrate carrying arrangement is typically a circular plate which carries a number of wafers. The circular plate or spoked target wheel is attached to a motor driven system which causes the plate to rotate at high speeds (not shown). The target 13 passes through the ion beam to receive its ion implantation.

According to the present invention, a plasma generator 16 generates plasma therein. The position of the plasma generator 16 is close enough to the target region to allow the plasma 17 to disperse or diffuse in the region of the target surface 13. While the plasma stream 17 depicted in FIG. 1 has a defined shape, its shape is merely to indicate its diffusion in the general region of the target which is bombarded by the ion beam. The passage way or opening through which the plasma exits the plasma generator typically faces the ion beam to minimize the flux of contaminants from the plasma generator to the process surface. In this case, the plasma is directed to the process surface by the momentum of the ion beam.

Any type of plasma generator is contemplated by the present invention including filamented arc plasma generators, microwave power generators and rf power generators. The plasma generator 16 can be mounted on the ion beam line generator housing or can be positioned close to the substrate carrying arrangement by its own support system.

Figure 2:
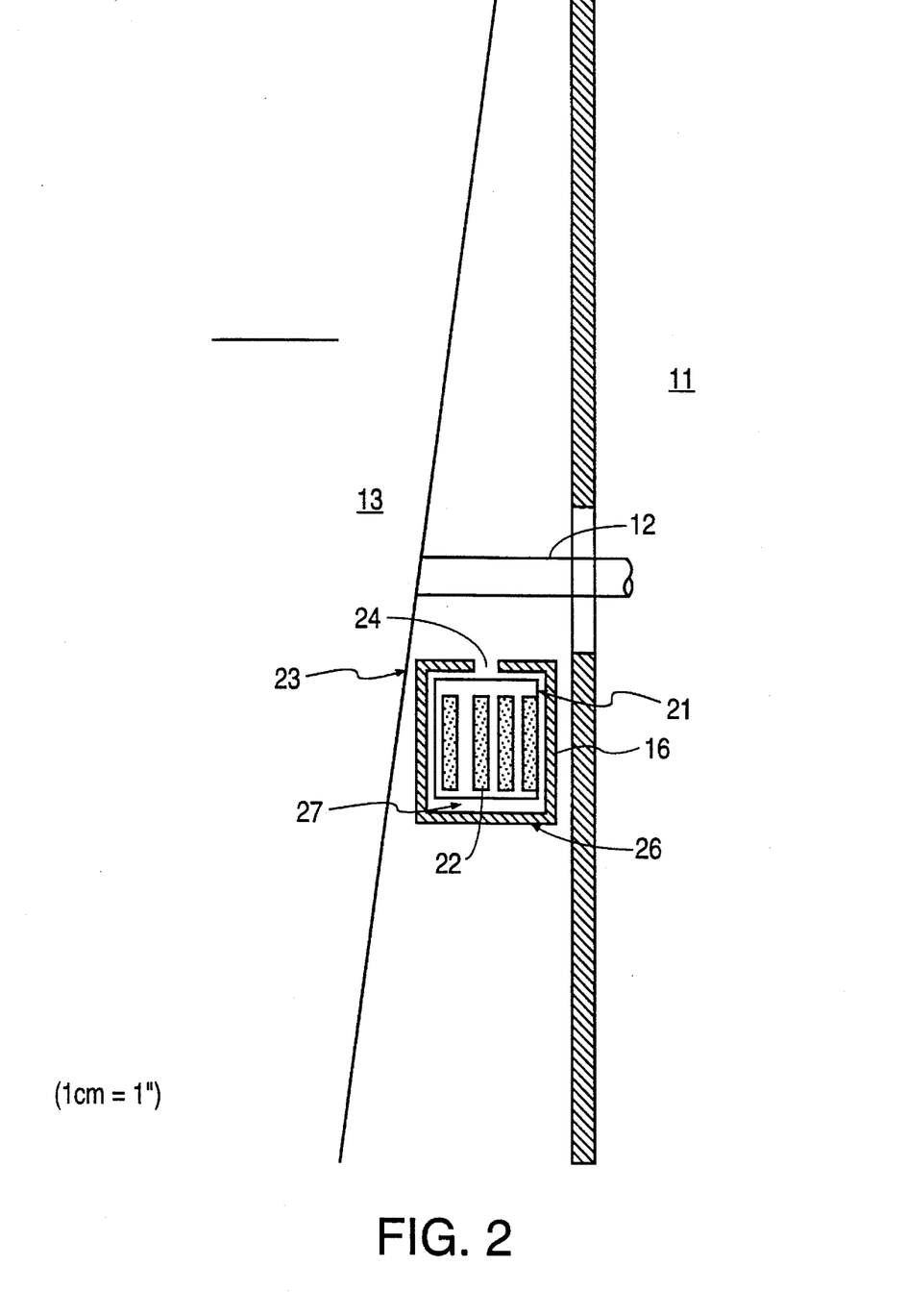
FIG. 2 is a top view of the system of the present invention similar that shown in FIG. 1.

FIG. 2 shows a more detailed drawing of how the plasma generator 16 can fit into the charged particle system, since there is typically limited space between the ion beam generator 11 and the wafer 13. The plasma generator 16 has a source chamber 21 with magnets (not required) 22. In the embodiment shown in FIG. 2, the magnetic filter 23 is across the aperture which provides the passage 24 for the plasma from the chamber to outside the chamber. The filter confines energetic electrons within the source chamber and allows ions and cold electrons through the aperture. The chamber is surrounded by the filter return yoke 26. The filter plate is preferably electrically insulated from the plasma chamber and filter yoke.

Figure 3:
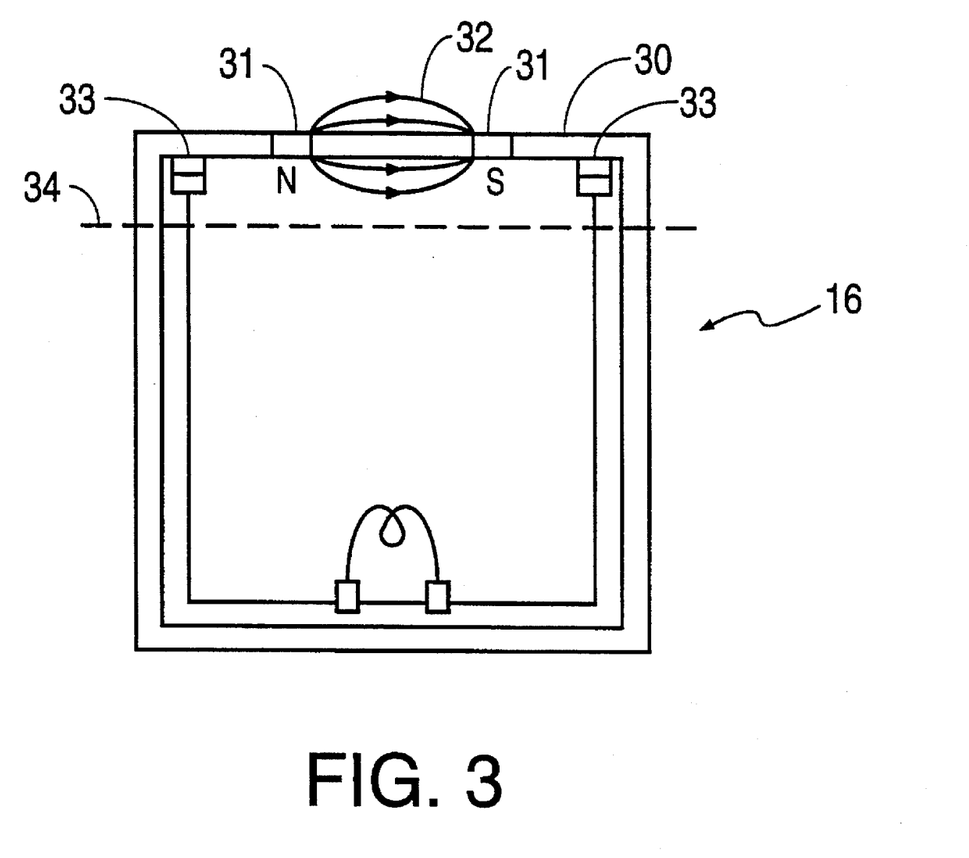
FIG. 3 is a more detailed schematic of a plasma generator in communication with a simple dipole magnetic filter, such used in accordance with the present invention.

FIG. 3 shows a more detailed drawing of the plasma generator 16 shown in FIG. 2. The passage wall 30 shown therein includes magnets which form the magnetic filter. This design uses permanent magnets, in which case, the filter performance is optimized by choosing the size, strength and spacing of the magnets and/or pole tips. For example, an iron pole tip can be used to shape and control the filter. In a preferred embodiment, the plasma chamber is electrically insulated from the filter/aperture wall 30 by insulator stand-offs 33 which can be made out of mylar, for example. Electrically insulating the passage wall from the chamber improves power efficiency by reducing primary electron loss on the filter wall. The passage wall thus becomes a float plate which draws zero net current, thus providing higher efficiency in the plasma generating process.

The magnetic filter is able to separate energetic electron from low energy electrons because the magnetic field causes high energy electrons to assume gyroscopic motion, because they have a low collision rate. Since the high energy electrons have gyroscopic motion, they are deflected back into the chamber. On the other hand, the low energy electrons are collisional, their trajectories are frequently changed by collisions and they do not assume a gyroscopic motion. Therefore they are able to pass through the magnetic field substantially without deflection. Gyro radius increases with (V) mass, so the ions of the plasma pass through the magnetic field to form the plasma outside the chamber because they assume a large gyroscope is large enough for them to pass through the magnetic radius around the magnetic filter field.

The dotted line 34 across the plasma generator in FIG. 3 indicates that the passage wall portion of the plasma generator is retrofitable onto existing plasma generators by any mechanically and electrically known means. Means includes any type of screws and bolts assembly or snapping clamps for fixedly attaching the chamber to a magnetic filter front plate assembly or welding the retrofit to the plasma chamber. The retrofit assembly could include the front plate assembly describe below in reference to FIGS. 8A through 10 or the rod assembly as discussed below as well. Depending upon the monetary value of the plasma generator, a retrofit may or may not be desirable.

The efficiency and proficiency of the magnetic field of the filter is dependent upon both its geometry and the magnetic flux, i.e., Gauss-cm, between electrons and the field-free region beyond the filter. The flux of the magnetic field, that is Gauss-cm, is a function of the design of the magnetic filter.

Figure 4:
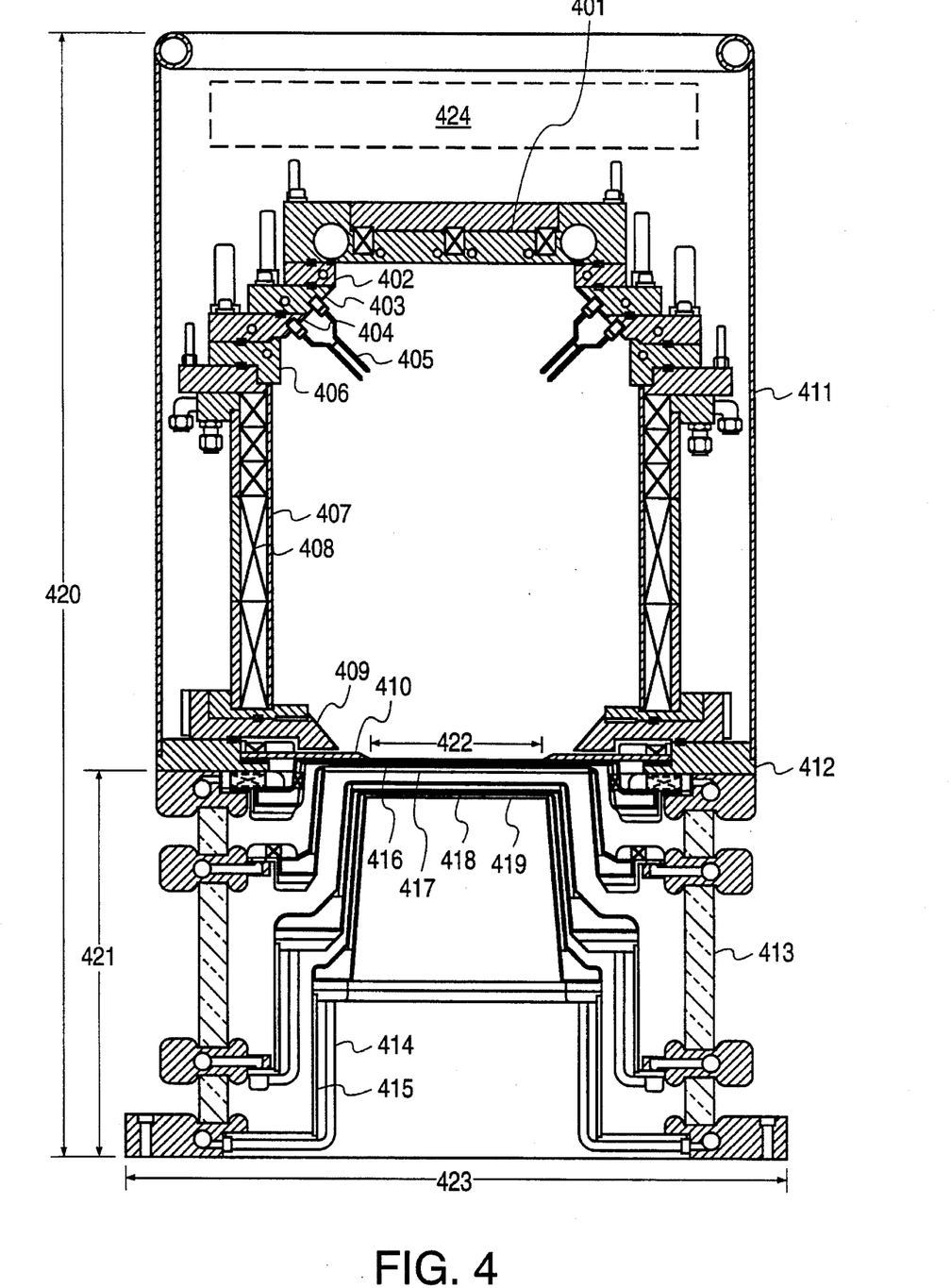
FIG. 4 is a front view schematic of a plasma generator with an extended magnetic filter used in accordance with the present invention; the extended magnetic filter is produced by the magnetic cusp near the electron dump.
Figure 5:
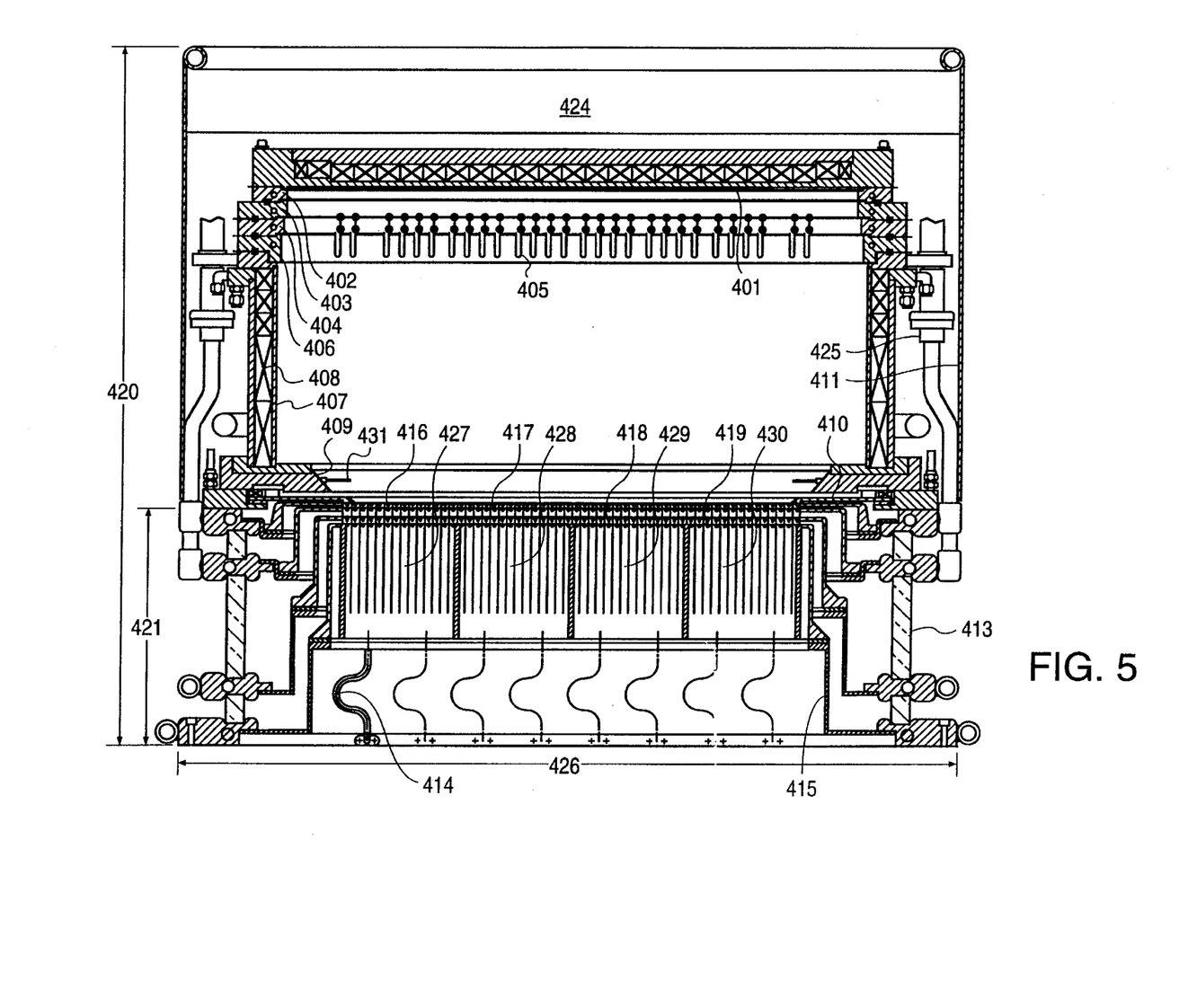
FIG. 5 is a side view of that shown in FIG. 4.

FIGS. 4 and 5 show a front view and a side view respectively of the U.S. common long pulse source (CLPS) plasma generator, having incorporated into its intrinsic design an extended magnetic filter. This design in discussed in *Review of Scientific Instrument*, Rev. Sci. Instr. 59, p. 2357 (1988). Such a system could be purchased through Burle Industries in Lancaster, Pa. for use in accordance with the present invention. FIGS. 6A–6D show certain elements of the CLPS geometry which are taken into account for its efficiency. For a magnetic field design goal, preferably there is a magnetic field of approximately 120 Gauss-cm between the primaries and cold plasma, thus separating the plasma into two regions within a single chamber.

Figure 7:
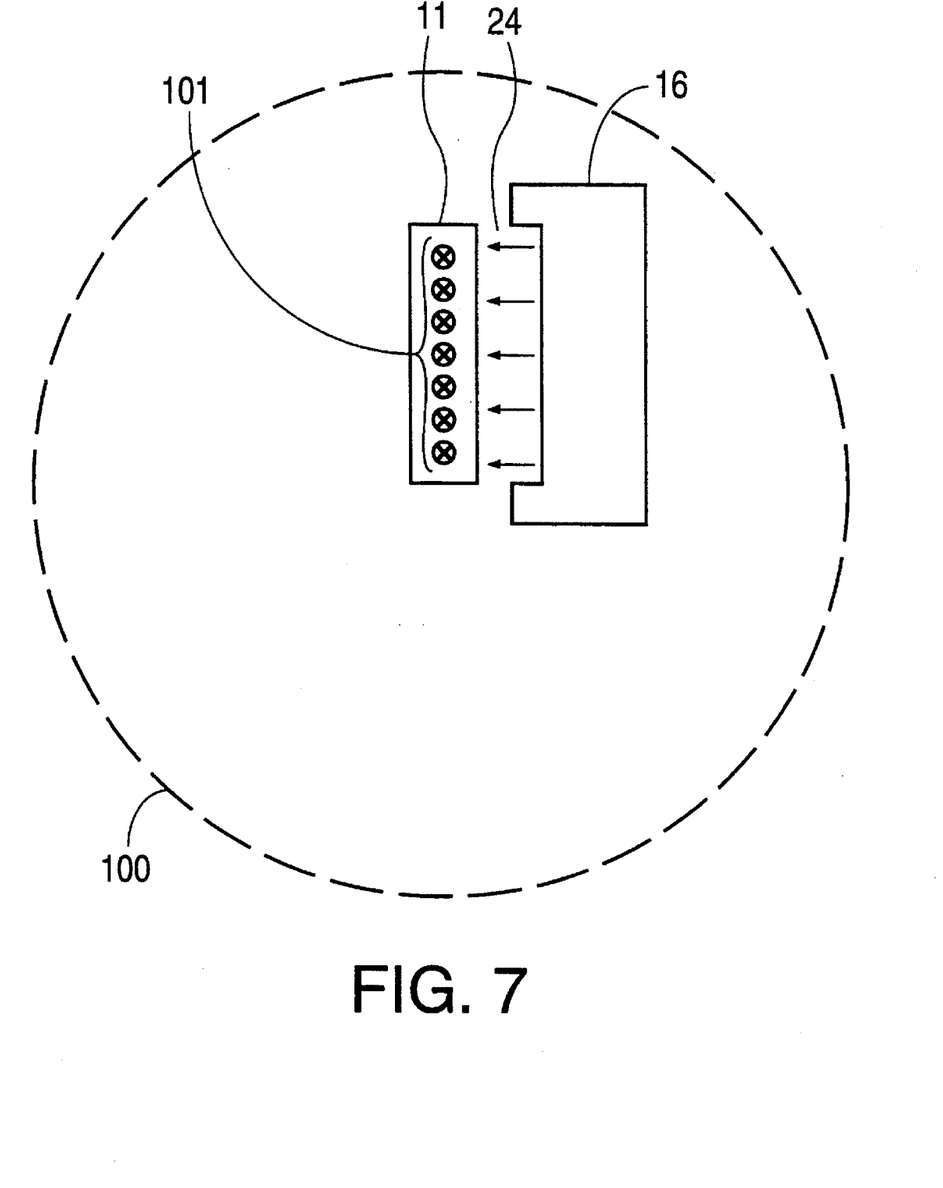
FIG. 7 shows a view of an ion beam directed out of the page; with a cold plasma generator on the right side of the beam.

FIG. 7 shows a wafer wheel 100, depicted by dotted lines to indicate that it is in front of the charged particle generator 11 and the plasma generator 16. The charged particle generator 11 depicted therein is an ion beam generator and shows an elongated ion beam 12 coming out of the page, thus showing an end view of the ion beamline just ahead of the target process surface. Passage 24 of the plasma generator is adjacent the ion beam as shown in FIG. 1. As discussed above, the cold plasma exits the plasma generator as the ion beam 12 passes adjacent to the passage 24 so that the cold plasma both diffuses onto the target surface and is directed by the momentum of the ion beam.

Where the charged particle generator 11 does not form the charge particles into an ion beam, such as in, for example a sputtering process, plasma etching process or plasma deposition or process or any other type of charge particle process in a semiconductor fabrication process, the cold plasma in accordance with the present invention can be diffused or dispersed along with the charge particles to cause reduction of the potential at the target process surface as described above with respect to the ion beam application of the present invention. In such a case, the desired amount of cold plasma to the non-directed or non-focused charged particles is dependent upon the chemical reactions of both the charged particles and the cold plasma and is balanced through routine experimental processes.

Figure 8A:
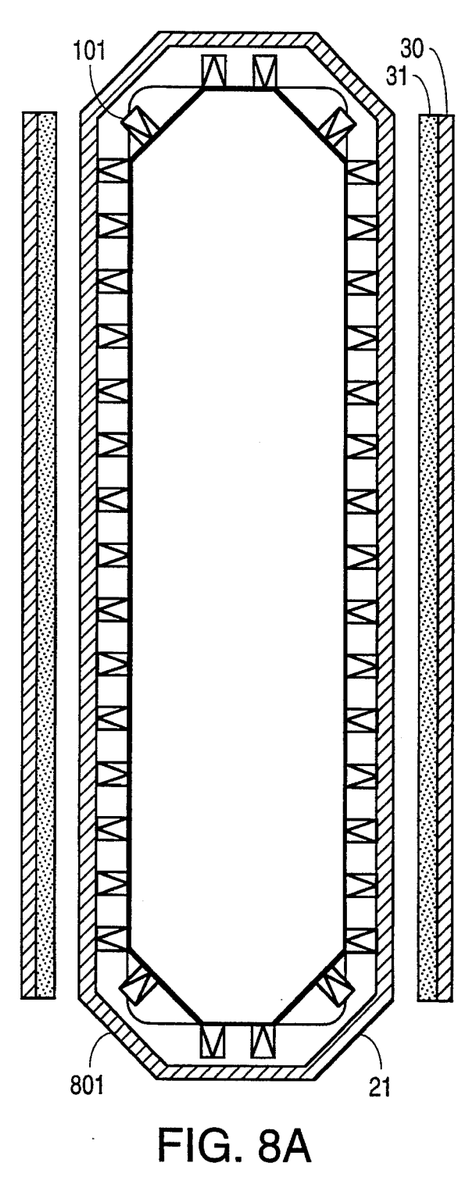
FIGS. 8A and 8B show the front view of a plasma generator and magnetic filter of the present invention.
Figure 8B:
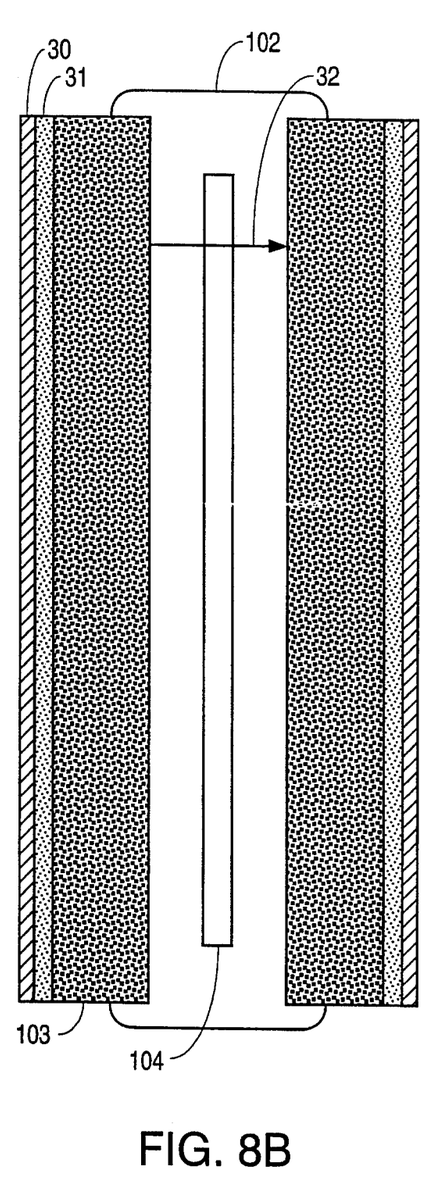

FIGS. 8A, 8B, 9, 10A and 10B depict parts of a small plasma generator where one inch of the drawing is roughly equal to about one centimeter in actuality. Thus, the actual plasma generator and its passage is about 40% the size depicted in the drawings. FIGS. 8A and 8B show the front view of the bucket which includes the chamber and magnetic filter. Referring to FIG. 8A, the chamber is shown having a number of magnets 101 imbedded within or into its walls, or associated therewith in a typical plasma chamber construction. The front plate of the source 102 is electrically insulated from the chamber and filter yoke. The filter magnet 31 and its return yoke 30 are also shown. Turning to FIG. 8B wherein the chamber is behind the front plate 102, filter "pole tips" 103 are also utilized as discussed above. The pole tips and/or magnets could be part of the front plate and insulated from plasma chamber and from filter yokes. The filter pole tips 103 are made of iron or other magnetically cooperative substance and are used to shape and/or control the magnetic filter. Magnetic field 32 passes between the magnetic elements, across the plasma passage or aperture 104, forming the magnetic filter in accordance with the present invention.

Figure 9:
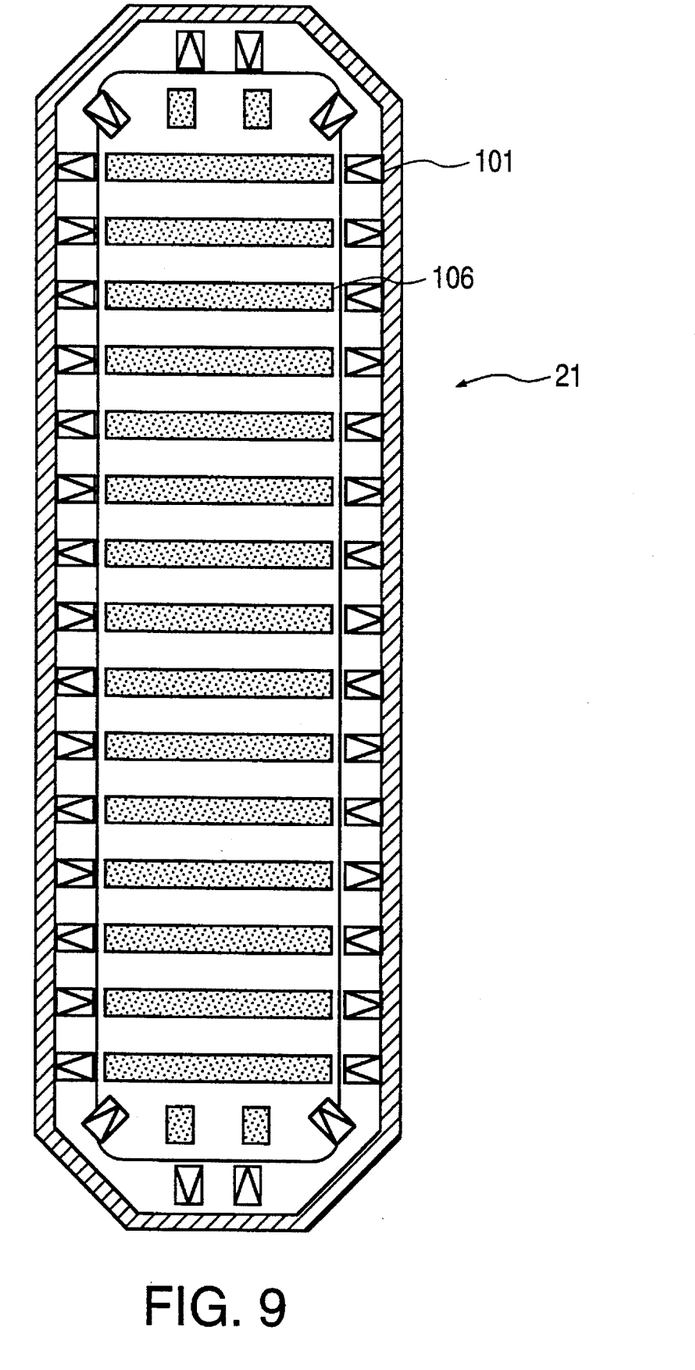
FIG. 9 show the end view of that shown in FIGS. 8A and 8B.
Figure 10A:
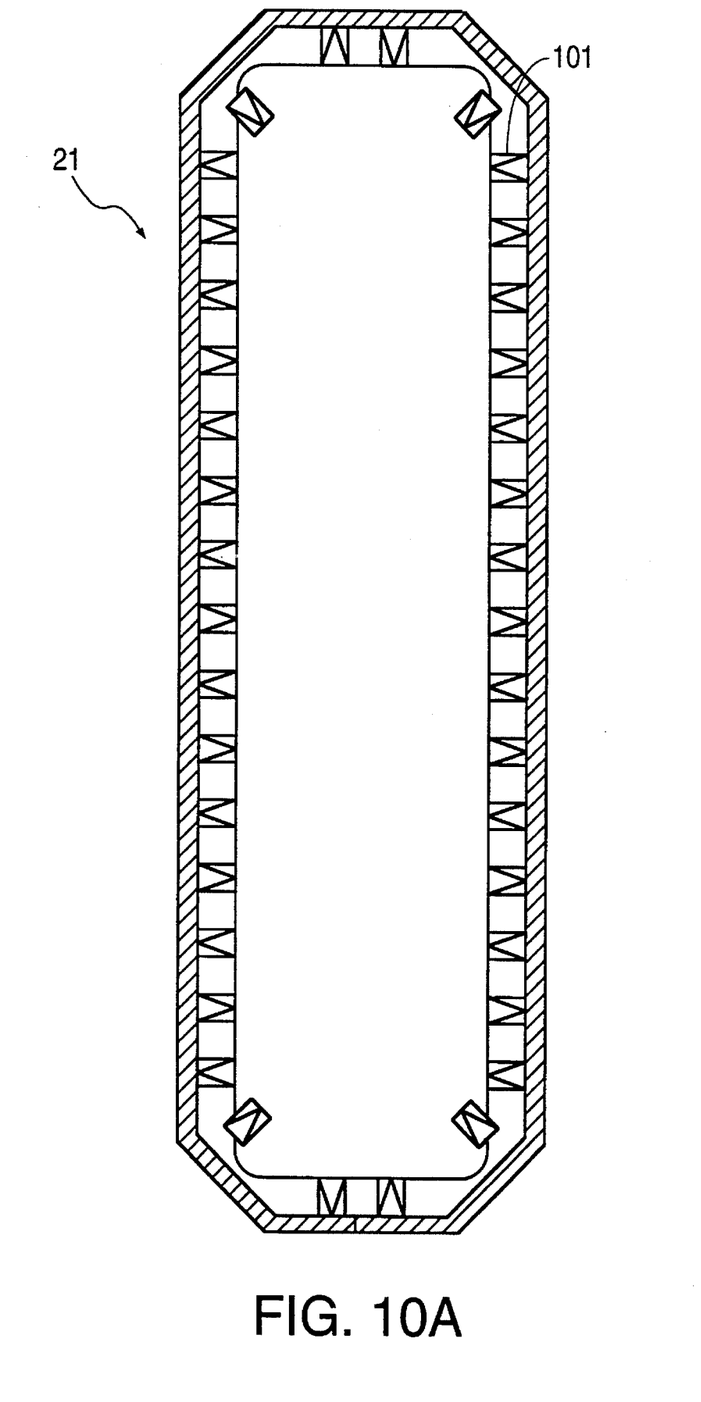
FIG. 10A also shows an end view of that shown in FIGS. 8A and 8B.
Figure 10B:
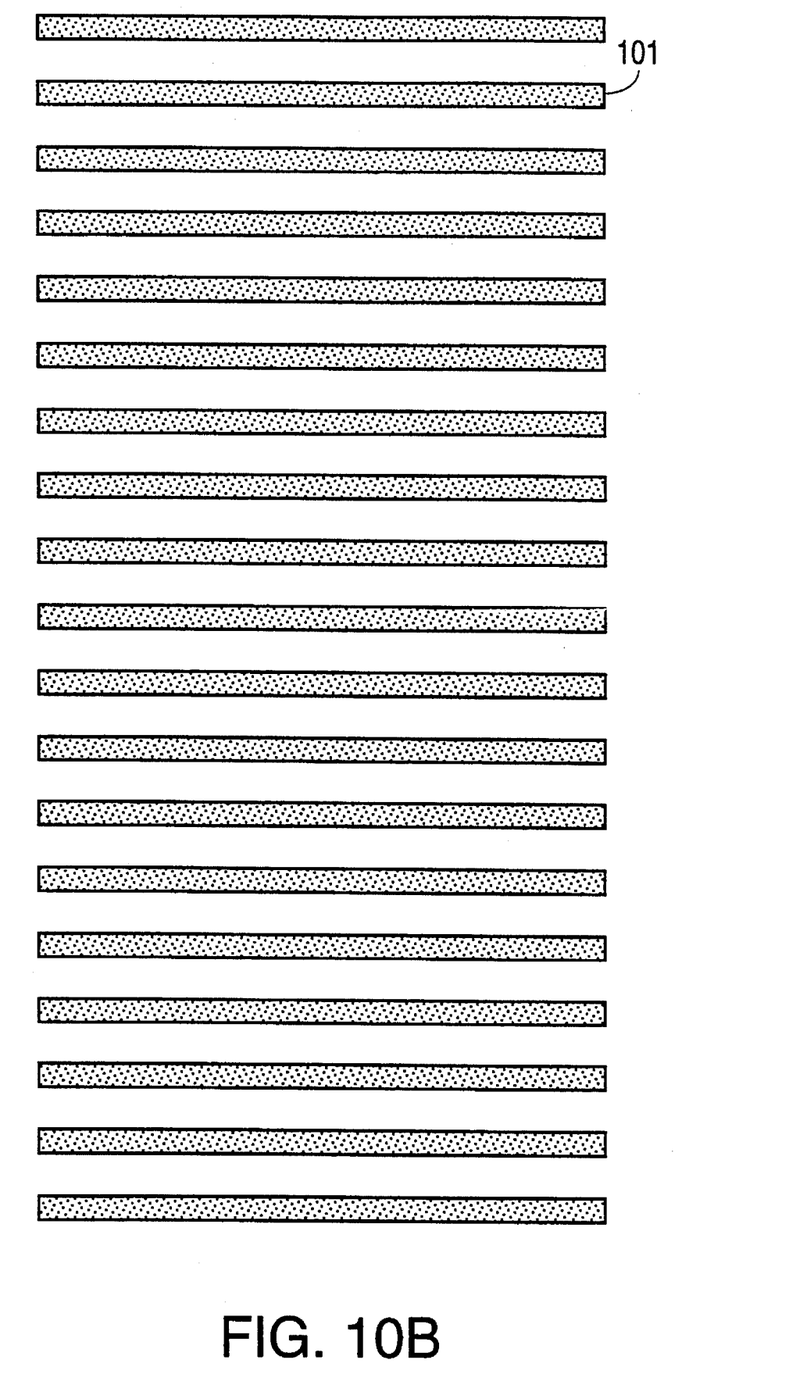
FIG. 10B shows a side view of the bucket magnets shown in FIGS. 8A, 8B, 9 and 10A.

Another view of the plasma generator with respect to the present invention is shown in FIG. 9 which depicts the end view of the backplate magnets 106, i.e., the source chamber wall opposite the front plate. In FIG. 10A, the same view as shown in FIG. 9 is provided, without the end or backplate magnets 106, the end view of the bucket is shown next to FIG. 10B to illustrate a side view of the bucket magnets 101 which are provided in cooperation with the chamber walls.

The plasma generators having magnetic filters in accordance with the present invention as depicted in FIGS. 4, 5, 6A–6D as the CLPS extended filter embodiment and then in FIGS. 8A, 8B, 9, 10A and 10B as the pole tip embodiment are but two manners in which to provide magnetic filters. Other magnetic filter configurations are also available and considered within the scope of the present invention. One example, in U.S. Pat. No. 4,447,732 issued to K. Leung et al. on May 8, 1984, a rod type of magnetic filter configuration is described therein. While the rod type design is a compact design, it tends to lack in power efficiency compared with an extended magnetic filter design.

While the invention has been described in conjunction with several specific embodiments, it is evident to those skilled in the art that many further alternatives, modifications and variations will be apparent in light of the foregoing description. Thus, the invention described herein is intended to embrace such alternatives, modifications, applications and variations as fall within the spirit and scope of the appended claims.

I claim:

1. A plasma generator apparatus used in performing charge particle processing on a substrate comprising:

a plasma generator for generating plasma;

a magnetic filter in communication with said generator;

said generator having a passage through which said plasma can pass;

a substrate carrying arrangement which positions a substrate in close enough proximity to said passage to provide that plasma is dispersed through said passage in the vicinity of the substrate on said substrate carrying arrangement.

2. An apparatus as recited in claim 1 further comprising a unit attachable to said generator which is includes said magnetic filter.

3. A plasma generator apparatus as recited in claim 1 wherein means for generating said charged particles is an ion beam generator.

4. An plasma generator apparatus for performing charged particle processing on a substrate comprising:

an apparatus for providing high energy ions;

a plasma generator for generating plasma;

a magnetic filter in communication with said generator;

said magnetic filter having a passage through which said plasma can pass from inside said generator to outside said generator;

a substrate carrying arrangement which positions a substrate in close enough proximity to said passage to provide that plasma which passes through said passage is dispersed in the vicinity of said substrate.

5. An apparatus as recited in claim 4 further comprising a unit attachable to said generator which includes said magnetic filter.

6. An apparatus as recited in claim 4 wherein said apparatus for providing high energy ions is an ion beam generator.

7. An apparatus as recited in claim 4 wherein said magnetic filter and said generator apparatus are electrically separated by insulation.

8. A charge particle processing apparatus comprising:

an charge particle generator which generates charged particles;

a target for receiving said charged particles;

a plasma generator which generates plasma having ions, primary and cold electrons; and a magnetic filter coupled to said plasma generator having a magnetic threshold which allows at least a portion of said ions and cold electrons to pass therethrough and retain certain of said primary electrons and wherein said magnetic filter is positioned in a manner which allows a substantial number of said certain cold electrons and ions to diffuse in the region of said target.

9. An apparatus as recited in claim 8 wherein said charge particle generator is an ion beam generator.

10. An apparatus as recited in claim 8 further comprising a unit attachable to said generator which includes said magnetic filter.

11. An apparatus as recited in claim 8 wherein said magnetic filter and said generator apparatus are electrically separated by insulation.

12. A charge particle processing system comprising:

means for generating charged particles;

a target for receiving said charged particles;

means for generating plasma having ions, primary and cold electrons; and magnetic filter means coupled to said plasma generating means, said magnetic filter having a magnetic threshold which allows at least a portion of said ions and cold electrons to pass therethrough and while retaining certain of said primary electrons and wherein said magnetic filter means is positioned in a manner which allows a substantial number of said certain cold electrons and ions to diffuse in the region of said target.

13. A system as recited in claim 12 wherein said means for generating charged particles is an ion beam generator.

14. A charged particle processing method comprising:

generating charged particles;

on a target, receiving said charged particles;

generating plasma having ions, primary and cold electrons; and in cooperation with said plasma generating step, magnetically filtering said plasma so that a substantial number of said ions and cold electrons of said plasma pass onto said target while keeping most of said primary electrons away from said target.

15. A method as recited in claim 14 further comprising the step of forming said generated charged particles into an ion beam.

* * * * *

UNITED STATES PATENT AND TRADEMARK OFFICE
CERTIFICATE OF CORRECTION

PATENT NO. : 5,545,257

DATED : August 13, 1996

INVENTOR(S) : Michael C. Vella

Page 1 of 4

It is certified that error appears in the above-identified patent and that said Letters Patent is hereby corrected as shown below:

Column 4, line 34  after "23", insert --(having a "mirror" magnet gradient)--;

line 39  after "26", insert --, which can be a single curved plate of 1/8" thick iron that is open top and bottom--;
delete "plate" and substitute --plane 27--;

line 41  after "yoke", insert --26--;

line 45  delete "," (second occurrence);

line 52  after "wall", insert --30--;

line 54  after "wall" (second occurrence), insert --30--;

Column 5, line 15  delete "describe" and substitute --described--;

line 28  delete "in" and substitute --is--;

line 32  after "invention.", insert --The element 401 designates an electron dump. The elements 402, 403, 404 and 406 designate, respectively, an insulator plate, a negative plate, a positive plate and a second insulator plate. The element 405 designates a filament. The element 407 designates a bucket wall and the element 408 designates a magnet. The element 409 designates a probe plate. The element 410 designates a mask. The element 411 designates a corona shield. The element 412 designates an interface plate. The element 413 designates an insulator assembly. The element 414 designates a cooling line. The element 415 designates an exit grid support hat. The elements 416, 417, 418 and 419 designate, respectively, a source grid, a gradient grid, a suppressor grid and an exit grid. The element 424 designates, generally, water supply and return manifolds, and a gas valve. The element 425 designates an accelerator grid water line. The elements 427, 428, 429 and 430 designate, respectively, a source grid, a gradient grid, a suppressor grid and an exit grid. The element 431 designates a probe. The dimension 420 is, illustratively, 31.496 inches (80.00 cm). The dimension 421 is, illustratively, 10.703 inches (27.19 cm). The dimension 422 is, illustratively, 4.724 inches (12.00 cm). The dimension 423 is, illustratively, 18.500 inches (46.99 cm). The

UNITED STATES PATENT AND TRADEMARK OFFICE
CERTIFICATE OF CORRECTION

PATENT NO. : 5,545,257

DATED : August 13, 1996

INVENTOR(S) : Michael C. Vella

Figure 6A:
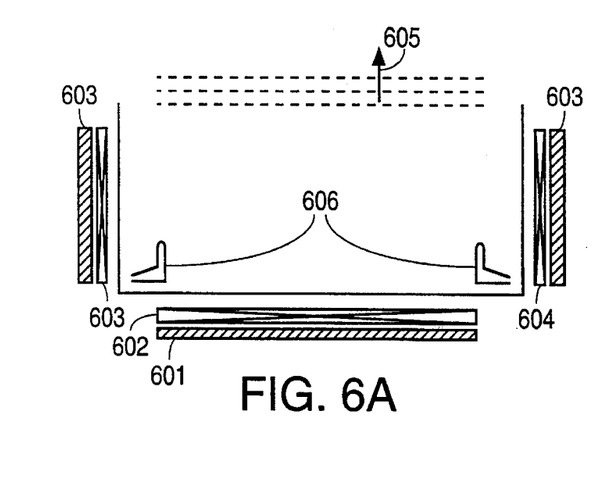
FIGS. 6A–6D show some of the design considerations of the extended magnetic filter as shown in FIGS. 4 and 5.
Figure 6B:
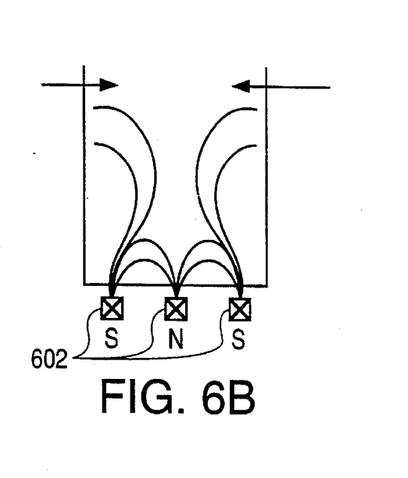
Figure 6C:
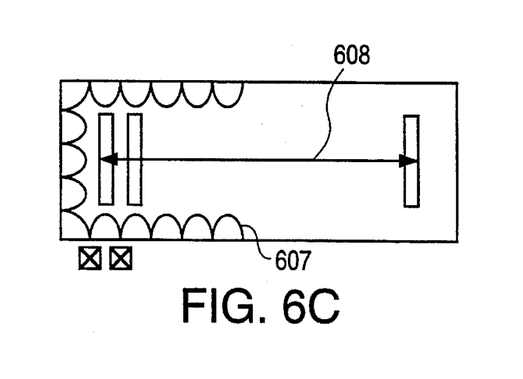
Figure 6D:
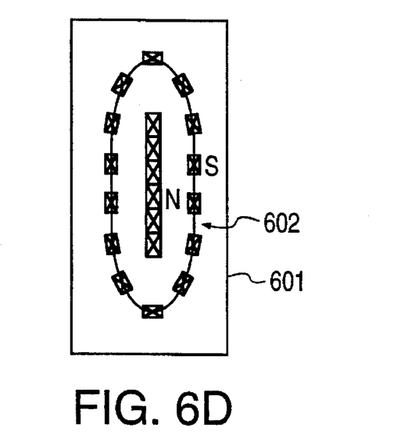

It is certified that error appears in the above-identified patent and that said Letters Patent is hereby corrected as shown below:

Column 5, line 32  dimension 426 is, illustratively, 33.706 inches (85.61 cm).--;
           line 32  begin a new paragraph with --FIGS. 6A-6D--;
           line 37  after "chamber.", insert --In FIG. 6A, the plates 601 and 603 can be made of, illustratively, iron. The element 602 designates back plate magnets. The element 604 designates side wall magnets. The element 605 designates an arrow showing the beam direction. The element 606 designates filaments. FIG. 6B shows filament placement in extended magnetic filters. The specification for the magnetic field can have a tolerance of ± 0.2 Gauss 1 cm before the extraction plane. In FIG. 6C, the side wall cusps 607, having a net 0 flux, are shown. The arrow designated as 608 indicates a 12 cm x 48 cm extraction. FIG. 6D illustrates an unbalanced hoop cusp formed near the back plate 601.--;
           line 51  delete "charge" and substitute --charged--;
           line 56  delete "charge" and substitute --charged--.
Column 6, line 3  after "chamber", insert --21--;
           line 4  after "filter", insert --The inner wall is designated as element 801.--;
           after "chamber", insert --21--;
           line 9  after "30", insert --(filament yoke)--;
           line 25  delete ", the" and substitute --. The--;
           line 50  delete "charge" and substitute --charged--;
           after "substrate", insert --,--;
           line 52  delete ";" and substitute --,--;
           line 53  delete "generator" and substitute --magnetic filter--;
           line 54  after ";", insert --and--;
           line 55  delete "a" (second occurence) and substitute --the--;
           line 60  after "1", insert --,--;
           line 61  after "unit", insert --,--;
           after "generator", insert --,--;
           delete "is";

UNITED STATES PATENT AND TRADEMARK OFFICE
CERTIFICATE OF CORRECTION

PATENT NO. : 5,545,257
DATED : August 13, 1996
INVENTOR(S) : Michael C. Vella

It is certified that error appears in the above-identified patent and that said Letters Patent is hereby corrected as shown below:

```
Column 6, line 63   after "1", insert --,--;
         line 64   delete "wherein" and substitute --further comprising--;
                   delete "said";
                   after "particles", insert --, wherein said means--;
         line 66   delete "An" and substitute --A--;
         line 67   after "substrate", insert --,--.
Column 7, line 1    delete "an apparatus" and substitute --means--;
         line 3    delete ";" and substitute --,--;
         line 7    delete "a" and substitute --the--;
         line 11   after "4", insert --,--;
         line 12   after "unit", insert --,--;
                   after "generator", insert --,--;
         line 14   after "4", insert --,--;
         line 15   delete "apparatus" and substitute --means--;
         line 17   after "4", insert --,--;
         line 18   delete "apparatus";
         line 20   delete "charge" and substitute --charged--;
                   after "apparatus", insert --,--;
         line 21   delete "an charge" and substitute --a charged--;
         line 25   after "primary", insert --electrons--;
         line 29   delete "retain" and substitute --retains--;
                   after "electrons", insert --,--;
         line 31   delete "certain" and substitute --portion of--;
         line 33   after "8", insert --,--;
                   delete "charge" and substitute --charged--;
         line 35   after "8", insert --,--;
         line 37   after "unit", insert --,--;
                   after "generator", insert --,--.
Column 8, line 1    after "8", insert --,--;
         line 2    delete "apparatus";
         line 4    delete "charge" and substitute --charged--;
                   after "system", insert --,--;
```

UNITED STATES PATENT AND TRADEMARK OFFICE
CERTIFICATE OF CORRECTION

PATENT NO.   : 5,545,257
DATED        : August 13, 1996
INVENTOR(S)  : Michael C. Vella It is certified that error appears in the above-identified patent and that said Letters Patent is hereby corrected as shown below:

```
Column 8, line 7    after "primary", insert --electrons--;
         line 13   after "filter", insert --means--;
         line 14   after "therethrough", insert --,--;
                   delete "and";
         line 15   delete "certain" and substitute --portion of--;
         line 20   after "12", insert --,--;
         line 22   after "method", insert --,--;
                   after "comprising", insert --the steps of--;
         line 25   delete "on a target,";
                   after "particles", insert --on a target--;
         line 22   after "primary", insert --electrons--;
         line 32   delete "while keeping";
         line 33   after "trons", insert --are kept--;
         line 34   after "14", insert --,--.
```

Signed and Sealed this

Eleventh Day of February, 1997

Attest:

BRUCE LEHMAN

*Attesting Officer*     *Commissioner of Patents and Trademarks*